(12) United States Patent
Umeda et al.

(10) Patent No.: US 11,629,046 B2
(45) Date of Patent: Apr. 18, 2023

(54) MEMS DEVICE

(71) Applicant: Murata Manufacturing Co., Ltd., Nagaokakyo (JP)

(72) Inventors: Keiichi Umeda, Nagaokakyo (JP);
Tadayuki Okawa, Nagaokakyo (JP);
Taku Kamoto, Nagaokakyo (JP);
Yuichi Goto, Nagaokakyo (JP);
Yoshihisa Inoue, Nagaokakyo (JP);
Takehiko Kishi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 335 days.

(21) Appl. No.: 16/885,914

(22) Filed: May 28, 2020

(65) Prior Publication Data
US 2020/0290865 A1    Sep. 17, 2020

Related U.S. Application Data

(63) Continuation of application No. PCT/JP2018/031559, filed on Aug. 27, 2018.

(30) Foreign Application Priority Data

Feb. 9, 2018    (JP) .............................. JP2018-022278

(51) Int. Cl.
*H01L 41/047* (2006.01)
*B81B 3/00* (2006.01)
(Continued)

(52) U.S. Cl.
CPC .......... *B81B 3/0021* (2013.01); *H01L 41/047* (2013.01); *H01L 41/053* (2013.01); *H01L 41/0805* (2013.01)

(58) Field of Classification Search
None
See application file for complete search history.

(56) References Cited

U.S. PATENT DOCUMENTS

| 10,998,857 B2 | 5/2021 | Umeda et al. |
| 11,251,776 B2 | 2/2022 | Nishimura et al. |

(Continued)

FOREIGN PATENT DOCUMENTS

| CN | 111264031 A | 6/2020 |
| JP | 2006140271 A | 6/2006 |

(Continued)

OTHER PUBLICATIONS

International Search Report Issued for PCT/JP2018/031559, dated Oct. 16, 2018.

(Continued)

*Primary Examiner* — Benjamin P Sandvik
(74) *Attorney, Agent, or Firm* — ArentFox Schiff LLP

(57) ABSTRACT

A MEMS device is provided that includes a piezoelectric film, a first electrode and a second electrode sandwiching the piezoelectric film, a protective film that covers at least part of the second electrode and having a cavity that opens part of the second electrode, a third electrode that contacts the second electrode at least in the cavity and is provided so as to cover at least part of the protective film, and a first wiring layer having a first contact portion in contact with the third electrode.

14 Claims, 14 Drawing Sheets

(51) Int. Cl.
  H01L 41/053 (2006.01)
  H01L 41/08 (2006.01)

(56) References Cited

U.S. PATENT DOCUMENTS

| | | | |
|---|---|---|---|
| 2005/0194626 A1* | 9/2005 | Noguchi | H01L 41/316 257/295 |
| 2006/0098059 A1 | 5/2006 | Ohguro et al. | |
| 2006/0209136 A1* | 9/2006 | Takahashi | B41J 2/14233 347/68 |
| 2007/0220723 A1 | 9/2007 | Furuya et al. | |
| 2012/0229573 A1* | 9/2012 | Mizukami | B41J 2/14233 347/50 |
| 2012/0236083 A1* | 9/2012 | Mizukami | B41J 2/1612 347/70 |
| 2015/0041932 A1 | 2/2015 | Herrin et al. | |
| 2016/0072039 A1* | 3/2016 | Iida | B41J 2/161 29/25.35 |
| 2018/0127268 A1* | 5/2018 | Fukumitsu | H03H 9/1057 |
| 2019/0074812 A1 | 3/2019 | Inoue et al. | |
| 2019/0245515 A1* | 8/2019 | Hurwitz | H03H 9/1014 |

FOREIGN PATENT DOCUMENTS

| | | |
|---|---|---|
| WO | 2016159022 A1 | 10/2016 |
| WO | 2017047663 A1 | 3/2017 |
| WO | 2017203757 A1 | 11/2017 |

OTHER PUBLICATIONS

Written Opinion of the International Searching Authority issued for PCT/JP2018/031559, dated Oct. 16, 2018.

* cited by examiner

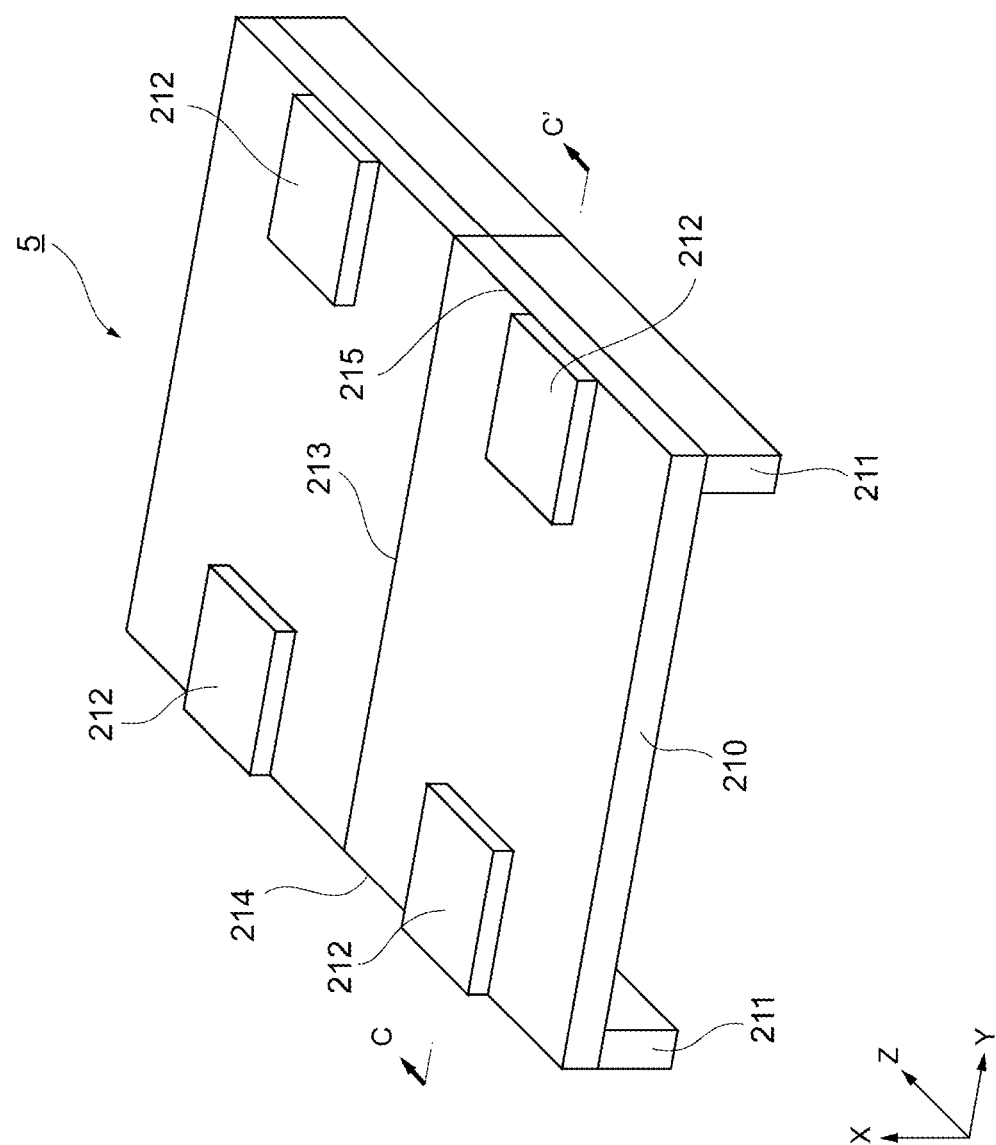

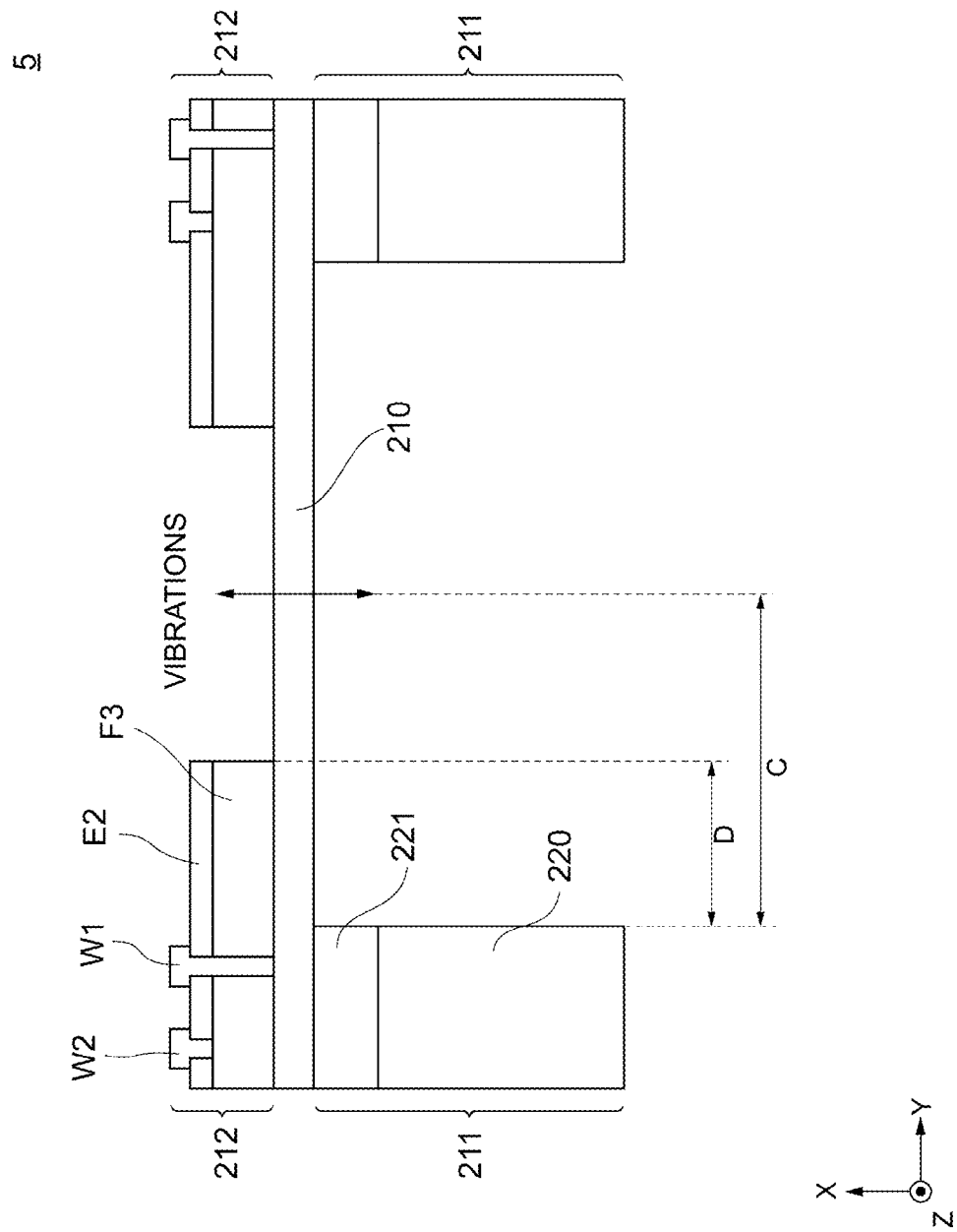

MEMS DEVICE

CROSS REFERENCE TO RELATED APPLICATIONS

The present application is a continuation of PCT/JP2018/031559 filed Aug. 27, 2018, which claims priority to Japanese Patent Application No. 2018-022278, filed Feb. 9, 2018, the entire contents of each of which are incorporated herein by reference.

TECHNICAL FIELD

The present invention relates to MEMS devices.

BACKGROUND

In recent years, devices manufactured by using a Micro Electro Mechanical Systems (MEMS) technique, in which a mechanical element component, sensor, actuator, and electronic circuit are integrated on a single silicon substrate, glass substrate, organic material or the like, have been widely used.

For example, a resonance device using such MEMS technique is disclosed in Patent Document 1 (identified below). Specifically, Patent Document 1 discloses a MEMS device (resonance device) able to obtain vibrations of a desired frequency by sandwiching a piezoelectric body between upper and lower electrodes and applying a voltage to the electrodes.

Patent Document 1: International Publication No. WO 2017/047663.

In such a MEMS device, for example, an upper electrode is in contact with relocation wiring for supplying an external voltage. In the MEMS device described in Patent Document 1, since the upper electrode is covered with a protective film, the upper electrode and the relocation wiring are connected in a via, where the protective film is partially removed to expose the upper electrode. In the MEMS device having this configuration, the voltage is applied to the piezoelectric body from the upper electrode, at the contact portion of the upper electrode and the relocation wiring. However, depending on the combination of materials used for the upper electrode and the piezoelectric body, dielectric strength of the contact portion is lowered.

SUMMARY OF THE INVENTION

Accordingly, the exemplary embodiments of the present invention has been conceived in view of such circumstances. Thus, it is an object of the present invention to provide a technique to prevent a decrease in dielectric strength caused by the connection with relocation wiring in a MEMS device.

In an exemplary aspect, a MEMS device is provided that includes a piezoelectric film, a first electrode and a second electrode sandwiching the piezoelectric film, a protective film provided to cover at least part of the second electrode and having a cavity that opens part of the second electrode, a third electrode that contacts the second electrode at least in the cavity and is provided so as to cover at least part of the protective film, and a first wiring layer having a first contact portion in contact with the third electrode.

According to the exemplary embodiment of the present invention, a technique is provided to prevent a decrease in dielectric strength caused by the connection with the relocation wiring in the MEMS device.

BRIEF DESCRIPTION OF DRAWINGS

FIG. 12A is a diagram for explaining a modification example of a MEMS device according to the exemplary embodiments.

FIG. 12B is a cross-sectional view taken along a line C-C' in FIG. 12A.

DETAILED DESCRIPTION OF EMBODIMENTS

First Exemplary Embodiment

Figure 1:
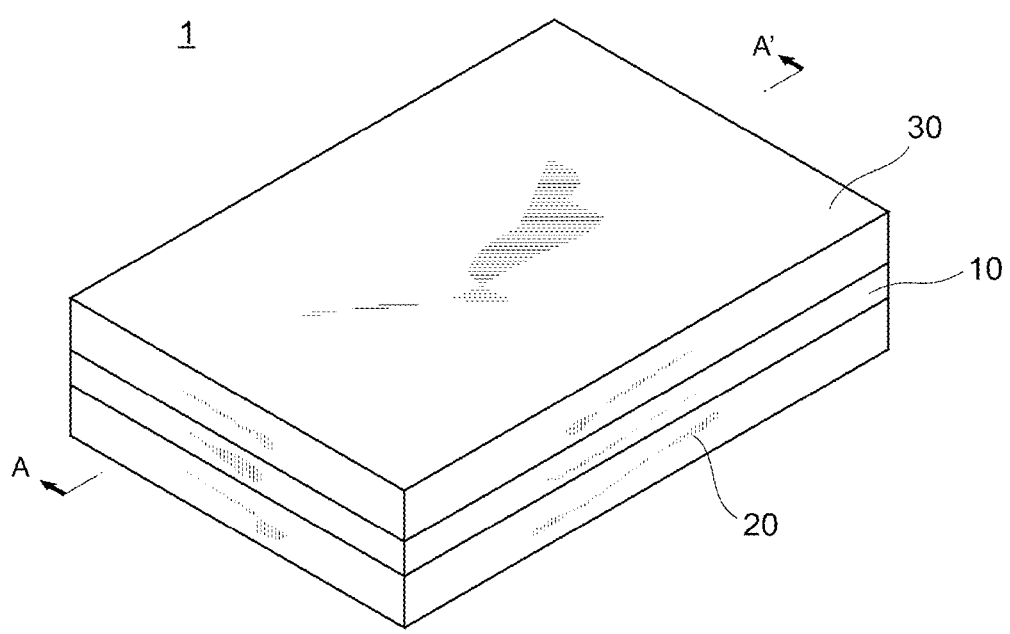
FIG. 1 is a perspective view schematically illustrating an external appearance of a resonance device according to a first exemplary embodiment.
Figure 2:
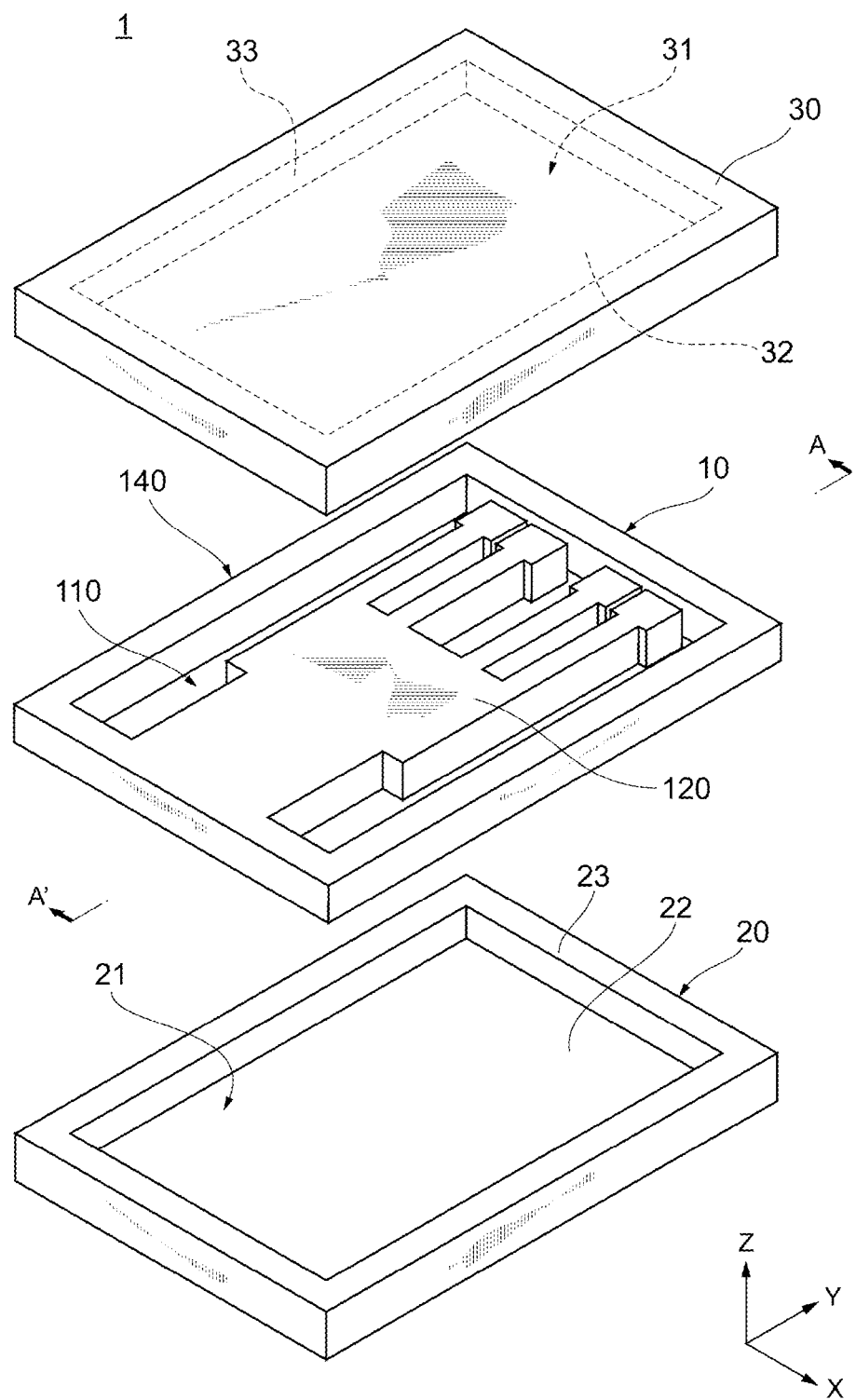
FIG. 2 is an exploded perspective view schematically illustrating a structure of a resonance device according to the first exemplary embodiment.

Hereinafter, a first embodiment will be described with reference to the accompanying drawings. FIG. 1 is a perspective view schematically illustrating an external appearance of a resonance device 1, which is a MEMS device, according to the first embodiment. FIG. 2 is an exploded perspective view schematically illustrating a structure of the resonance device 1 according to the first embodiment.

The resonance device 1 is configured such that a lower lid 20, a resonator 10 (hereinafter, the lower lid 20 and the resonator 10 are also collectively referred to as a "MEMS substrate"), and an upper lid 30 are laminated and joined in that order.

In the exemplary aspect, the resonator 10 is a MEMS vibrator manufactured by using a MEMS technique.

Figure 4:
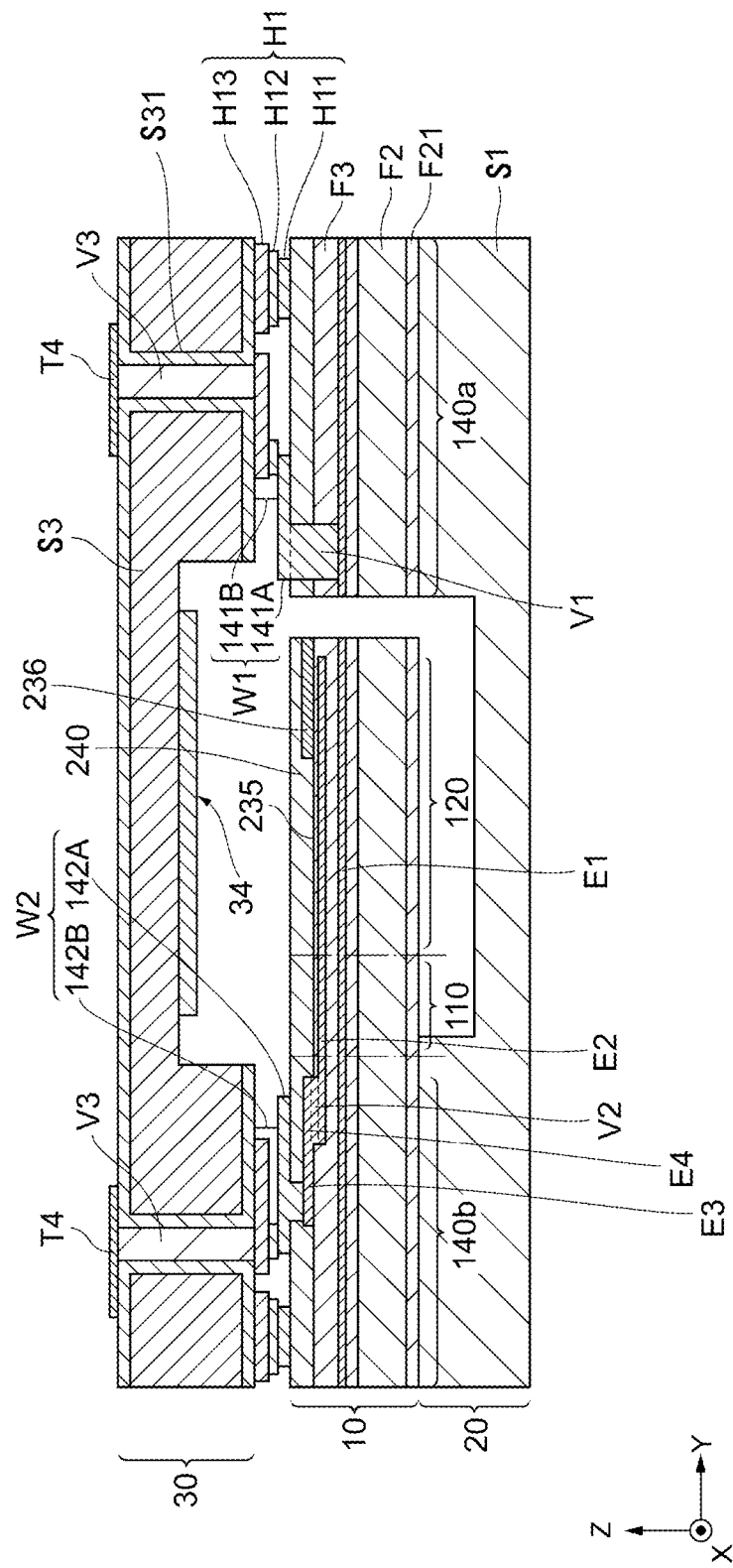
FIG. 4 is a cross-sectional view taken along a line A-A' in FIG. 1.

The resonator 10 and the upper lid 30 are joined to each other via a joining portion H1, which will be described later and is shown in FIG. 4, for example. The resonator 10 and the lower lid 20 are each formed using an Si substrate, and the Si substrates are joined to each other. The resonator 10 is sealed by the upper lid 30, the lower lid 20, a holding portion 140 (i.e., the frame) of the resonator 10 to be described later, and the joining portion H1, thereby forming an airtight vibration space. The MEMS substrate (i.e., the resonator 10 and the lower lid 20) may be formed using an SOI substrate or a glass substrate, for example.

Each of the configurations of the resonance device 1 will be described below. In the following description, of the resonance device 1, a side on which the upper lid 30 is disposed is referred to as an upper (or front) side, while the side on which the lower lid 20 is disposed is referred to as a lower (or rear) side.

Upper Lid 30

The upper lid 30 extends forming a flat plate shape along an X-Y plane, and a recess 31 having, for example, a flat rectangular parallelepiped shape is formed in a rear surface of the upper lid 30. The recess 31 is surrounded by a side wall 33, and forms part of a vibration space, which is a space where the resonator 10 vibrates. Two penetration electrodes V3 are formed in the upper lid 30. It is noted that the upper lid 30 may not have the recess 31, and may be configured to have a flat plate shape. A getter layer 34 is formed on a surface on the resonator 10 side of the recess 31 of the upper lid 30.

MEMS Substrate

Lower Lid 20

The lower lid 20 includes a bottom plate 22 provided along the X-Y plane and having a rectangular flat plate shape, and a side wall 23 extending from a peripheral edge of the bottom plate 22 in a Z-axis direction (that is, in a lamination direction of the lower lid 20 and the resonator 10). In the lower lid 20, a recess 21 formed by a surface of the bottom plate 22 and an inner surface of the side wall 23 is provided in a surface facing the resonator 10. The recess 21 forms part of the vibration space of the resonator 10. By the upper lid 30, the lower lid 20, the holding portion 140 (i.e., frame), and the joining portion H1, the vibration space is hermetically sealed to maintain a vacuum state. The vibration space may be filled with a gas, such as an inert gas. It is noted that the lower lid 20 may not have the recess 21, and may be configured to have a flat plate shape. A getter layer may be formed on a surface on the resonator 10 side of the recess 21 of the lower lid 20.

Resonator 10

Figure 3:
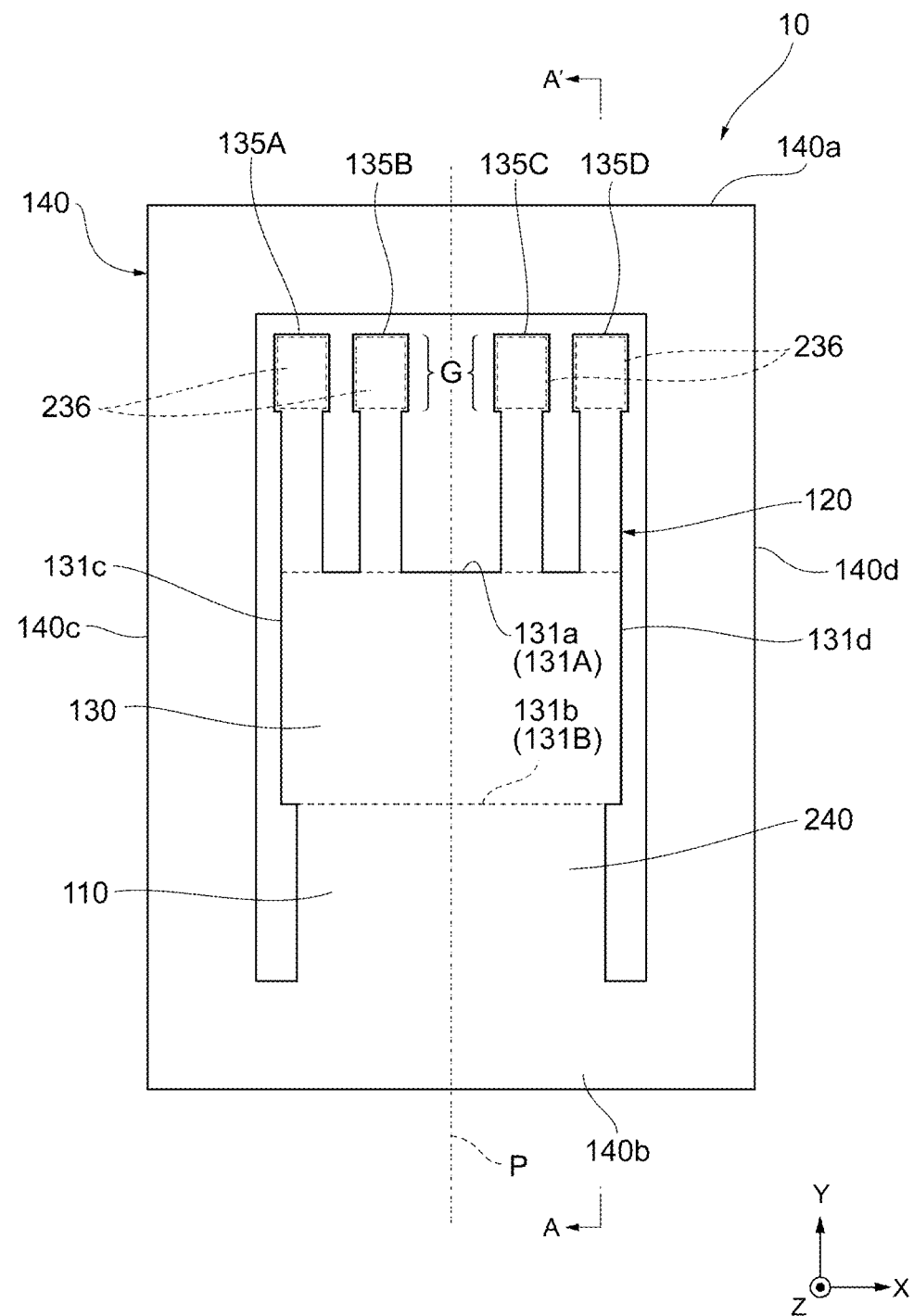
FIG. 3 is a plan view of a resonator according to the first exemplary embodiment.

FIG. 3 is a plan view schematically illustrating a structure of the resonator 10 according to the present embodiment. The resonator 10 is a MEMS vibrator manufactured by using the MEMS technique, and performs an out-of-plane vibration in the X-Y plane in the orthogonal coordinate system in FIG. 3. It is noted that the resonator 10 is not limited to the resonator using an out-of-plane bending vibration mode illustrated in FIG. 3, and may be configured as a spread vibration mode, a thickness longitudinal vibration mode, a Lamb wave vibration mode, an in-plane bending vibration mode, and a surface acoustic wave vibration mode. These configurations can be applied to a timing device, an RF filter, a duplexer, an ultrasonic transducer, a gyro sensor, and an acceleration sensor. In addition, they may be used for a piezoelectric mirror having an actuator function, a piezoelectric gyro, a piezoelectric microphone having a pressure sensor function, an ultrasonic vibration sensor, and the like. Further, they may be applied to an electrostatic MEMS element, an electromagnetically driven MEMS element, and a piezoresistive MEMS element.

The resonator 10 includes a vibration portion 120, the holding portion 140, and a holding arm 110.

The holding portion 140 (or frame) is formed in a rectangular frame shape to surround an outer side portion of the vibration portion 120 along the X-Y plane. For example, the holding portion 140 is integrally formed from a prismatic-shape frame body. It is sufficient that the holding portion 140 is provided in at least part of the periphery of the vibration portion 120, and the shape thereof is not limited to the frame shape.

The holding arm 110 is provided on the inner side of the holding portion 140 to connect the vibration portion 120 and the holding portion 140.

The vibration portion (an example of a piezoelectric vibration portion) 120 is provided on the inner side of the holding portion 140, and a space is formed between the vibration portion 120 and the holding portion 140 at a predetermined interval. In the example illustrated in FIG. 3, the vibration portion 120 includes a base portion (or base) 130 and four vibration arms 135A to 135D (also collectively referred to as "vibration arms 135"). It is noted that the number of vibration arms is not limited to four, and may be set to any number, for example, one or more. In the present embodiment, each of the vibration arms 135 and the base portion 130 are integrally formed.

The base portion 130 has long sides $131a$, $131b$ in an X-axis direction and short sides $131c$, $131d$ in a Y-axis direction, in a plan view. The long side $131a$ is a side of a front end surface 131A (hereinafter also referred to as a "front end 131A") of the base portion 130, and the long side $131b$ is a side of a rear end surface 131B (hereinafter also referred to as a "rear end 131B") of the base portion 130. In the base portion 130, the front end 131A and the rear end 131B oppose each other.

The base portion 130 is connected to the vibration arms 135, which will be described later, at the front end 131A, and is connected to the holding arm 110, which will be described later, at the rear end 131B. In the example of FIG. 3, the base portion 130 is formed in a substantially rectangular shape in a plan view, but is not limited thereto, and may be formed to be substantially plane-symmetrical with respect to a virtual plane P defined along a perpendicular bisector of the long side $131a$. In an alternative aspect, the base portion 130 may have a trapezoidal shape in which the long side $131b$ is shorter than the long side $131a$, or have a semicircular shape in which the long side $131a$ is taken as the diameter, for example. Moreover, each surface of the base portion 130 is not limited to a flat surface, and may be a curved surface. The virtual plane P is a plane passing through the center in a direction in which the vibration arms 135 are arranged in the vibration portion 120.

In the base portion 130, the base portion length, which is the longest distance between the front end 131A and the rear end 131B in a direction from the front end 131A toward the rear end 131B, is about 35 μm, for example. The base portion width, which is the longest distance between side ends of the base portion 130 in a width direction orthogonal to the base portion length direction, is about 265 μm, for example.

The vibration arms 135 extend in the Y-axis direction and respectively have the same size. Each of the vibration arms 135 is provided between the base portion 130 and the holding portion 140 in parallel to the Y-axis direction, and one end thereof is connected to the front end 131A of the base portion 130 to be a fixed end while the other end thereof is an open end. Each of the vibration arms 135 is provided being aligned in parallel with one another at a predetermined interval in the X-axis direction. It is also noted that the vibration arm 135 has a width in the X-axis direction of about 50 μm and has a length in the Y-axis direction of about 465 μm, for example.

A portion extending about 150 μm in length from the open end of each vibration arm 135 has a width wider than that of the other portion of the vibration arm 135 in the X-axis direction, for example. The portion having the widened width is referred to as a weight portion G. For example, the weight portion G is wider than the other portion of the vibration arm 135 by 10 μm each on the left and right sides along the X-axis direction, so that the width thereof in the X-axis direction is approximately 70 μm, for example. The weight portion G is integrally formed by the same process as that of the vibration arm 135. By forming the weight portion G, the weight per unit length of the vibration arm 135 is heavier at the open end side than at the fixed end side. Accordingly, since each of the vibration arms 135 has the weight portion G at the open end side, amplitude of vibrations in an up-down direction of each vibration arm can be increased.

In addition, a protective film 235 as shown in FIG. 4, for example, is formed on a surface of the vibration portion 120 (i.e., a surface facing the upper lid 30) to cover the entire surface thereof. Moreover, a frequency adjustment film 236 is formed on a surface of the protective film 235 at a leading end on the open end side of each of the vibration arms 135A to 135D. A resonant frequency of the vibration portion 120 can be adjusted by the protective film 235 and the frequency adjustment film 236.

In the present embodiment, the entirety of the surface of the resonator 10 (i.e., the surface on the side facing the upper lid 30) is substantially covered with the protective film 235. In addition, the entirety of the surface of the protective film 235 is substantially covered with a parasitic capacitance reduction film 240. It is noted that the protective film 235 may cover at least the vibration arm 135, and is not limited to the configuration substantially covering the entire surface of the resonator 10.

Lamination Structure

A lamination structure of the resonance device 1 will be described with reference to FIG. 4. FIG. 4 is a cross-sectional view taken along a line A-A' in each of FIGS. 1 to 3. As illustrated in FIG. 4, in the resonance device 1 according to the present embodiment, the holding portion 140 of the resonator 10 is joined onto the side wall 23 of the lower lid 20 to form the MEMS substrate. The holding portion 140 of the resonator 10 and the side wall 33 of the upper lid 30 are joined to each other by the joining portion H1, so that the MEMS substrate and the upper lid 30 are joined. The MEMS substrate and the upper lid 30 form the vibration space in which the vibration arms 135 vibrate. As further shown terminals T4 are formed on an upper surface of the upper lid 30 (i.e., a surface on the opposite side to a surface facing the resonator 10). The terminals T4 and the resonator 10 are electrically connected to each other by relocation wiring W1 and wiring W2.

2-1. Upper Lid 30

The upper lid 30 is formed of an Si (silicon) wafer S3 having a predetermined thickness, for example. As illustrated in FIG. 4, the upper lid 30 is joined, at the peripheral portion (side wall 33) thereof, to the holding portion 140 of the resonator 10 by the joining portion H1, which will be described later. It is preferable that, in the upper lid 30, the surface facing the resonator 10, the rear surface, and the side surface of the penetration electrode V3 be covered with a silicon oxide film S31. The silicon oxide film S31 is formed on a surface of the Si wafer S3 by, for example, oxidation of the surface of the Si wafer S3 or chemical vapor deposition (CVD).

The getter layer 34 is formed on the surface of the recess 31 of the upper lid 30 on the side facing the resonator 10. Moreover, the getter layer 34 is formed of a material easy to be oxidized such as Ti (titanium), Zr (zirconium), or the like, and is configured to adsorb outgas generated in the vibration space formed by the upper lid 30 and the lower lid 20. Since the getter layer 34 is formed substantially on the entirety of the surface of the recess 31 facing the resonator 10, the upper lid 30 according to the present embodiment may sufficiently adsorb the outgas to maintain the vibration space in a vacuum state.

In an exemplary aspect, the terminal T4 is formed by filling a conductive material such as polycrystalline silicon (poly-Si) doped with impurities, Cu (copper), Au (gold), single crystal silicon doped with impurities, or the like, into the through-hole V3 formed in the upper lid 30. The terminal T4 functions as wiring for electrically connecting an external power source to the resonator 10.

2-2. MEMS Substrate: Lower Lid 20

The bottom plate 22 and the side wall 23 of the lower lid 20 are integrally formed by an Si (silicon) wafer S1. The lower lid 20 is joined to the holding portion 140 of the resonator 10 with the upper surface of the side wall 23. A thickness of the lower lid 20 defined in the Z-axis direction is, for example, 150 μm, and a depth of the recess 21 is 50 μm, for example. The Si wafer S1 is formed of non-degenerate silicon, and its resistivity is, for example, 16 mΩ·cm or more.

2-3. MEMS Substrate: Resonator 10

In the resonator 10, the holding portion 140, the base portion 130, the vibration arms 135, and the holding arm 110 are integrally formed by the same process. In the resonator 10, a metal layer (an example of a first electrode; hereinafter also referred to as a "lower electrode") E1 is laminated first on an Si (silicon) substrate F2 (an example of a substrate). A piezoelectric thin film F3 is laminated on the metal layer E1 to cover the metal layer E1, and a metal layer (an example of a second electrode; hereinafter also referred to as an "upper electrode") E2 is further laminated on the piezoelectric thin film F3. The protective film 235 is laminated on the metal layer E2 to cover the metal layer E2, and the parasitic capacitance reduction film 240 is laminated on the protective film 235.

The Si substrate F2 is formed of, for example, a degenerate n-type Si semiconductor having a thickness of about 6 μm, and may include P (phosphorus), As (arsenic), Sb (antimony), or the like as n-type dopant. A resistivity of the degenerate Si used for the Si substrate F2 is, for example, less than 16 mΩ·cm, and more preferably equal to or less than 1.2 mΩ·cm. A silicon oxide (for example, $SiO_2$) layer F21 (an example of a temperature characteristics correction layer) is formed on a lower surface of the Si substrate F2. This makes it possible to improve the temperature characteristics. The silicon oxide layer F21 may be formed on an upper surface of the Si substrate F2, or may be formed on both the upper surface and the lower surface of the Si substrate F2.

Moreover, the metal layers E2 and E1 are, for example, equal to or greater than 0.1 μm and equal to or smaller than 0.2 μm in thickness, and are patterned to a desired shape by etching or the like after the film formation. In the metal layers E2 and E1, a metal whose crystal structure is a body-centered cubic structure is used. Specifically, the metal layers E2 and E1 are formed using Mo (molybdenum), tungsten (W), or the like.

The metal layer E1 is formed so as to be configured and function as the lower electrode, for example, on the vibration portion 120. On the holding arm 110, the holding portion 140, and the like, the metal layer E1 is formed so as to function as wiring for connecting the lower electrode to an AC power source provided outside of the resonator 10. The metal layer E1 is connected to the terminal T4 via the relocation wiring (an example of a second wiring layer) W1.

On the other hand, the metal layer E2 is formed so as to be configured and to function as the upper electrode on the vibration portion 120. On the holding arm 110, the holding portion 140, and the like, the metal layer E2 is formed so as to function as wiring for connecting the upper electrode to a circuit provided outside of the resonator 10. In this embodiment, the metal layer E2 is extended by a via V2, which will be explained later, and a metal layer E3, and then is connected to the terminal T4 via the relocation wiring (an example of a first wiring layer) W2.

The piezoelectric thin film F3 is a thin film of a piezoelectric body configured to convert an applied voltage into vibrations, and is formed of a material whose crystal structure takes a wurtzite hexagonal crystal structure. As an example, the piezoelectric thin film F3 may mainly contain nitride or oxide, such as AlN (aluminum nitride), ScAlN (scandium aluminum nitride), ZnO (zinc oxide), GaN (gallium nitride), InN (indium nitride), or the like. ScAlN is a material in which part of aluminum in aluminum nitride is substituted with scandium, and may be substituted with two elements such as Mg and Nb, Mg and Zr, or the like instead of scandium. The thickness of the piezoelectric thin film F3 is, for example, about 800 nm.

In operation, the piezoelectric thin film F3 expands and contracts in an in-plane direction of the X-Y plane, that is, in the Y-axis direction in accordance with an electric field applied to the piezoelectric thin film F3 by the metal layers E2 and E1. Due to the expansion and contraction of the piezoelectric thin film F3, the vibration arm 135 displaces its free end toward the inner surfaces of the lower lid 20 and the upper lid 30, and vibrates in an out-of-plane bending vibration mode.

In the present embodiment, the phase of an electric field applied to the vibration arms 135A and 135D in the outer side portion and the phase of an electric field applied to the vibration arms 135B and 135C in the inner side portion are set to be opposite to each other. With this, the vibration arms 135A and 135D in the outer side portion and the vibration arms 135B and 135C in the inner side portion are displaced in the opposite directions to each other. For example, when the vibration arms 135A and 135D in the outer side portion displace their free ends toward the inner surface of the upper lid 30, the vibration arms 135B and 135C in the inner side portion displace their free ends toward the inner surface of the lower lid 20.

The protective film 235 may be formed of a material that is configured to prevent the upper electrode E2 for piezoelectric vibrations from being oxidized and whose mass reduction rate by etching is slower than that of the frequency adjustment film 236. Specifically, the protective film 235 may be formed of an insulating film such as SiN, $SiO_2$ (silicon oxide), or $Al_2O_3$ (alumina oxide) in addition to a piezoelectric film such as AlN, ScAlN, ZnO, GaN, InN, or the like. The mass reduction rate is represented by a product of an etching rate (thickness removed per unit time) and density. The protective film 235 has a thickness of, for example, about 0.2 μm.

The frequency adjustment film 236 is formed substantially on the entire surface of the vibration portion 120, and thereafter is formed only in a predetermined region by processing such as etching. The frequency adjusting film 236 is formed of a material having a faster mass reduction rate by etching than the protective film 235. Specifically, the frequency adjustment film 236 is formed of a metal such as molybdenum (Mo), tungsten (W), gold (Au), platinum (Pt), nickel (Ni), titanium (Ti), or the like, for example. In the present embodiment, the frequency adjustment film 236 is formed of molybdenum.

When a relationship of mass reduction rate between the protective film 235 and the frequency adjustment film 236 is as described above, the relationship of magnitude in etching rate may be arbitrarily determined.

The parasitic capacitance reduction film 240 is formed of tetraethyl orthosilicate (TEOS). The parasitic capacitance reduction film 240 has a thickness of about 1 μm. The stated film reduces parasitic capacitance in a routing wiring portion, and functions as an insulating layer when wiring lines having different potentials cross each other and also functions as a standoff to expand the vibration space.

2-4. Joining Portion

As further shown, the joining portion H1 is formed in a rectangular annular shape along the X-Y plane between the resonator 10 and the upper lid 30. The joining portion H1 couples the resonator 10 and the upper lid 30 by eutectic coupling to seal the vibration space of the resonator 10. In the present embodiment, the joining portion H1 is formed by laminating an Al layer H11, a Ge layer H12, and an Al layer H13 in that order. By using the same kind of metal for the joining portion H1 as that of a joining layer of the wiring metals W1 and W2 to be described later, the manufacturing process may be simplified. In FIG. 4, although the Al layer H11, the Ge layer H12, and the Al layer H13 are described as respective independent layers, interfaces thereof are actually coupled to one another by eutectic coupling. For example, the joining portion H1 may be formed of a film of Au (gold), Sn (tin), or the like. The joining portion H1 may be a combination of Au and Si, Au and Au, Cu and Sn, or the like. In order to improve a close-contact property, Ti, TiN, TaN, or the like may be thinly sandwiched between the layers.

Connection Mode

Next, a connection mode of the relocation wiring W1 and the metal layer (lower electrode) E1, and a connection mode of the relocation wiring W2 and the metal layer (upper electrode) E2 will be described.

3-1. Relocation Wiring W1

The relocation wiring W1 is connected to the metal layer E1, and applies a voltage supplied from the terminal T4 to the metal layer E1. The relocation wiring W1 is configured by a contact electrode (an example of a second contact portion) 141A and a connection layer 141B. The contact electrode 141A is formed of, for example, a metal such as Al (aluminum), Au (gold), Sn (tin), or the like, and is formed so as to be in contact with the metal layer E1. The connection layer 141B is configured by eutectic coupling of an Al layer and a Ge layer, for example, and electrically connects the contact electrode 141A to the terminal T4.

At the time of connecting the contact electrode 141A of the relocation wiring W1 to the metal layer E1, the piezoelectric thin film F3, the metal layer E2, the protective film 235, and the parasitic capacitance reduction film 240 laminated on the metal layer E1 are partially removed until the metal layer E1 is exposed, thereby forming a via V1. The formation is carried out such that the inside of the formed via V1 is filled with the contact electrode 141A, whereby the metal layer E1 and the contact electrode 141A are connected to each other. In an exemplary aspect, it is preferable that a connecting portion between the metal layer E1 and the contact electrode 141A be a region in an outer side portion of the vibration portion 120, and in the present embodiment, the connection portion is connected to the holding portion 140 (see FIG. 4).

3-2. Relocation Wiring W2

The relocation wiring W2 is connected to the metal layer E3, and applies a voltage supplied from the terminal T4 to the metal layer E2. The relocation wiring W2 is configured by a contact electrode (an example of a first contact portion) 142A and a connection layer 142B. The contact electrode 142A is formed of, for example, a metal such as Al (aluminum), Au (gold), Sn (tin), or the like, and is formed so as to make contact in the metal layer E3. The connection layer 142B is configured by eutectic coupling of an Al layer and a Ge layer, for example, and electrically connects the contact electrode 142A to the terminal T4.

Figure 5:
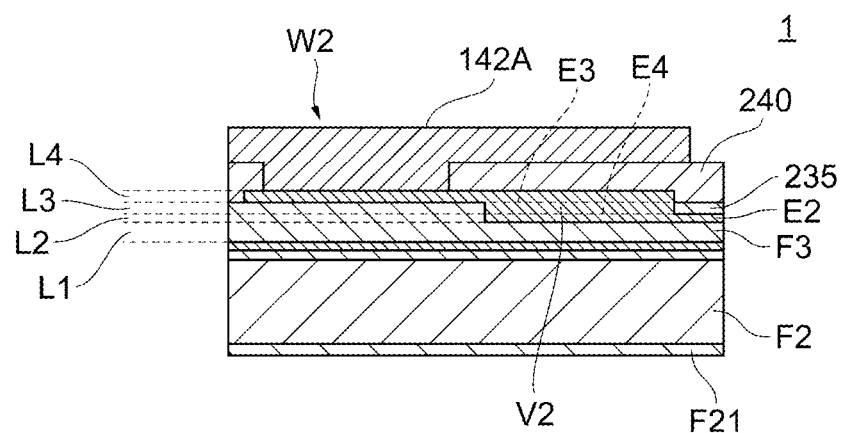
FIG. 5 is a schematic diagram illustrating a connection mode of a resonance device according to the first exemplary embodiment.

Referring to FIG. 5, a connection mode of the relocation wiring W2 and the metal layer E2 will be described. FIG. 5 is a schematic diagram in which a connecting portion between the relocation wiring W2 and the resonator 10 in FIG. 4 is enlarged and depicted.

At the time of connecting the contact electrode 142A of the relocation wiring W2 to the metal layer E2, the protective film 235 and the parasitic capacitance reduction film 240 laminated on the metal layer E2 are partially removed until the metal layer E2 is exposed, thereby forming a via V2. The via V2 is then filled with a metal E4 made of a material similar to that of the metal layer E2. The metal E4 is part of the metal layer E3.

The via V2 is covered with the metal layer E3. The metal layer E3 extends from the via V3 over a region on the opposite side in a direction in which the vibration arm 135 expands (that is, a region in the outer side portion of the resonator 10). In other words, the metal layer E3 is formed so as to be offset with respect to the metal layer E2 in a plan view (e.g., the lamination direction) in a region other than the region covering the via V2 (to rephrase, a region other than the region that functions as the vibration portion 120). The metal layer E3 is formed of, for example, Mo or W. Since the metal layer E3 is made of the same material as that of the frequency adjustment layer 236, the metal layer E3 can be formed by the same process as that of the frequency adjustment layer 236. The thickness of the metal layer E3 is, for example, about 330 nm.

The relocation wiring W2 is formed of the contact electrode 142A and the connection layer 142B. The contact electrode 142A is a metal layer of, for example, Al, Au, Sn or the like. The contact electrode 142A is connected to the metal layer E3 in a region different from the region covering the via V2 in the metal layer E3. In the present embodiment, the metal layer E3 and the contact electrode 142A are connected to each other in a region extended from the via V2 in the metal layer E3. Moreover, it is preferable that a connecting portion between the metal layer E3 and the contact electrode 142A be a region in an outer side portion of the vibration portion 120, and in the present embodiment, the connecting portion is connected to the holding portion 140 as shown in FIG. 4, for example.

In the example of FIG. 5, only one contact electrode 142A is described, but the present invention is not limited thereto, and a configuration including a plurality of contact electrodes 142A may also be employed. In this case, since the metal layer E3 is brought into contact with the plurality of contact electrodes 142A, the metal layer E3 is connected to the relocation wiring W2 at a plurality of locations.

Here, in the resonator 10, a plane where the piezoelectric thin film F3 is formed is taken as a layer L1, a plane where the metal layer E2 is formed is taken as a layer L2, a plane where the via V2 is formed is taken as a layer L3, and a plane where the metal layer E3 is formed is taken as a layer L4. Then, according to the connection mode of the present embodiment, a layer for applying a voltage to the piezoelectric thin film F3 is the layer L2, where the metal layer E2 is formed. On the other hand, the contact electrode 142A of the relocation wiring W2 applies a voltage to the metal layer E3 in the layer L4.

As described above, according to the connection mode of the present embodiment, the layer in which the relocation wiring W2 applies a voltage differs from the layer in which a voltage is applied to the piezoelectric thin film F3. In particular, the present embodiment takes a structure (offset structure) in which the region where the relocation wiring W2 applies a voltage (that is, a contact portion between the contact electrode 142A and the metal layer E3) and the region where a voltage is applied to the piezoelectric thin film F3 (that is, the via V2) are offset in a plan view. Because of this configuration of this embodiment, only the protective film 235 is formed between the piezoelectric thin film F3 and a connecting portion of the contact electrode 142A and the metal layer E3.

In the present embodiment, the metal layer E2, the metal E4, and the metal layer E3 are formed of the same material (Mo or W) as a main ingredient, and the contact electrode 142A of the relocation wiring W2 is formed of a material (Al), as a main ingredient, which is different from the above-described same material.

Figure 6:
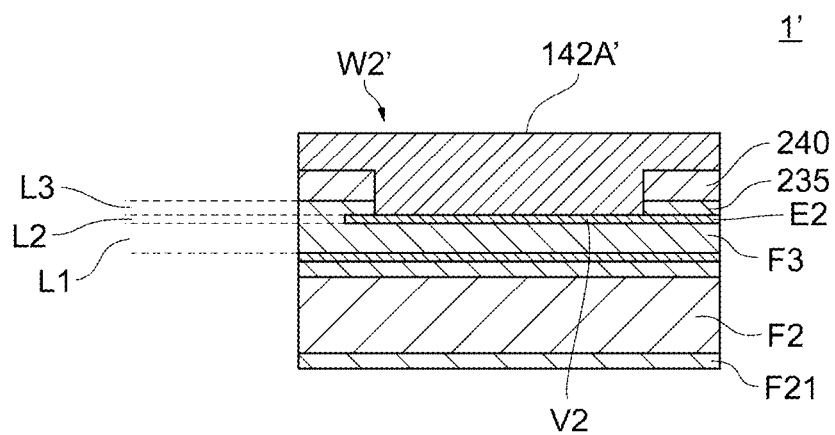
FIG. 6 is a schematic diagram illustrating a connection mode of a resonance device of a comparative example.

Effects of the above connection mode will be described with reference to FIG. 6 and FIG. 7. FIG. 6 corresponds to FIG. 5, and schematically illustrates a connection mode of a metal layer E2 and a contact electrode 142A' in an existing resonance device 1' as a comparative example. In the resonance device 1', the contact electrode 142A' is formed so as to make contact with a metal layer E2' within the via V2 formed on the metal layer E2. That is, in the resonance device 1' of the comparative example, any of a layer where a voltage is applied to a piezoelectric thin film F3 and a layer where a voltage is applied by the relocation wiring W2 is the layer L3. In the example of FIG. 6, Al is used as the contact electrode 142A', Mo is used as the metal layer E1 and as the metal layer E2, and AlN is used as the piezoelectric thin film F3.

Figure 7:
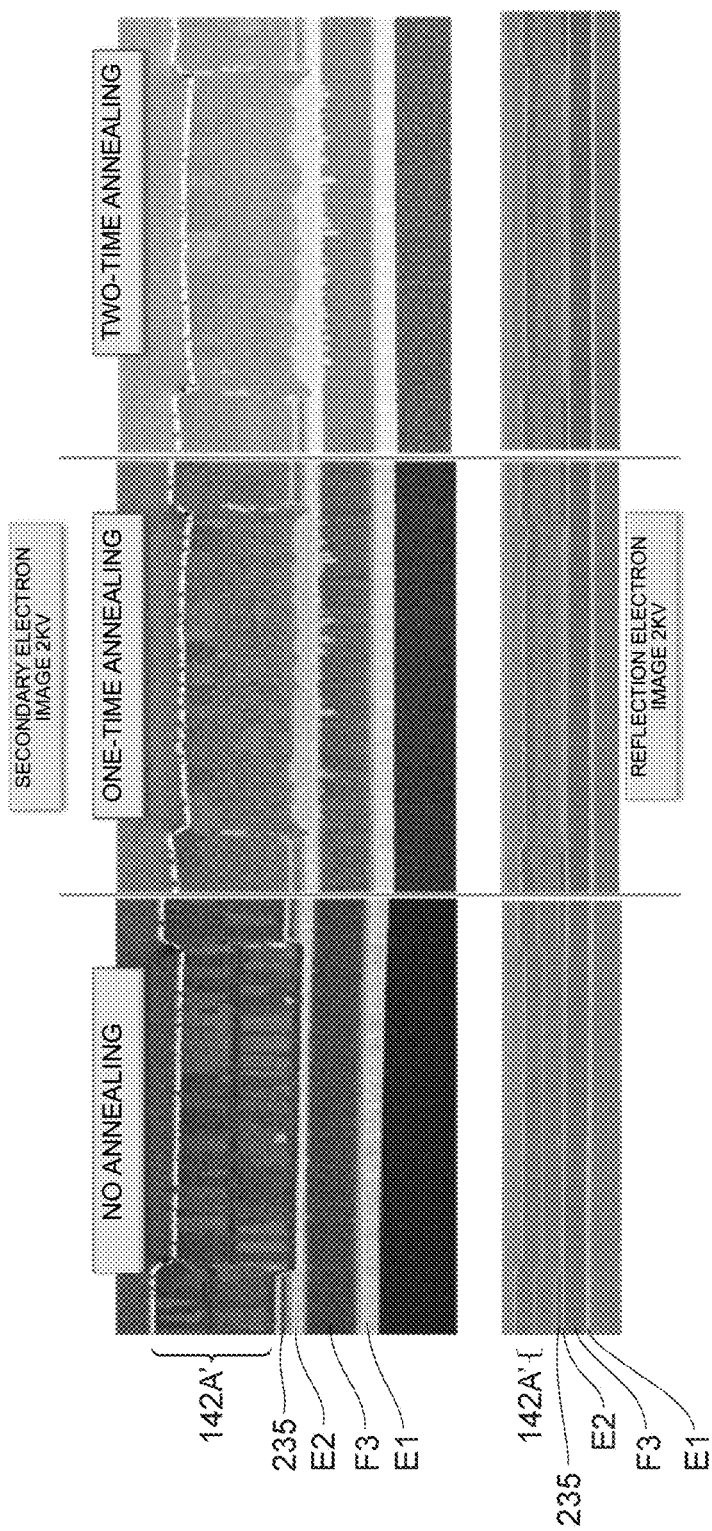
FIG. 7 is a SEM image illustrating a cross-sectional structure after heat treatment is performed on a resonance device of a comparative example.

FIG. 7 illustrates SEM images of a cross section of the resonance device 1' having the connection mode illustrated in FIG. 6, in a case where an annealing process is carried out 0 to 2 times. A SEM image obtained by observing secondary electrons detected when a voltage of 2 kV is applied is given on the upper side of FIG. 7, and a SEM image obtained by observing reflection electrons detected when a voltage of 2 kV is applied is given on the lower side of FIG. 7.

In any of the two kinds of SEM images in FIG. 7, when the annealing process is not carried out, a boundary of each of the layers is clear, whereas when the annealing process is repeated, it is understood that Al of the contact electrode 142A' is diffused into the piezoelectric thin film F3 due to the thermal load by the annealing process. Specifically, Al of the contact electrode 142A' is diffused along a grain boundary in a columnar growth structure of AlN of the piezoelectric thin film F3. This phenomenon is a phenomenon peculiar to a crystal film oriented in the C-axis of AlN or the like of the piezoelectric thin film F3. In particular, it has been found that the phenomenon occurs when Mo of the metal layer E2 is thin (about 100 nm or less), but does not occur when the metal layer E2 is not formed, Mo thereof has a certain thickness (for example, about 300 nm), or the like. It may be considered that the diffusion due to the thermal load is attributable to the diffusion barrier performance of a metal such as Mo, or the stability property of Mo nitride. That is, thin Mo has a low barrier performance, and basically is not capable of functioning as a barrier against the diffusion of Al into AlN. Further, it may be assumed that Mo nitride is too unstable to hold nitrogen taken from AlN, so that the nitrogen is transferred to Al; as a result, the nitrogen of AlN is taken near the interface, and particularly, the nitrogen is taken at the grain boundary of AlN in which the coupling force between the atoms is originally weak, so that Al having passed through a thin Mo layer with an insufficient barrier performance is diffused in the grain interface. It is considered that such phenomenon is not limited to Mo, and may also be applied to a material that forms unstable nitride, such as tungsten.

In manufacturing the resonance device 1, the thermal load is applied to the resonance device 1 by heat treatment to achieve eutectic joining at the joining portion H1 (for example, about 420° C. to 440° C. in the case of Al—Ge coupling), or by an outgas annealing process before joining (about 450° C. to 500° C.). Accordingly, in the connection mode of the existing resonance device 1', as illustrated in FIG. 7, the contact electrode 142A' is diffused into the piezoelectric thin film F3. As a result, dielectric strength between the electrodes of the resonator 10 is lowered, and surge resistance is deteriorated.

In contrast, according to the connection mode of the resonance device 1 according to the present embodiment, the layer in which the relocation wiring W2 applies a voltage differs from the layer in which a voltage is applied to the piezoelectric thin film F3. In particular, the present embodiment takes a structure (specifically, an offset structure) in which the region where the relocation wiring W2 applies a voltage (that is, the contact portion between the contact electrode 142A and the metal layer E3) and the region where a voltage is applied to the piezoelectric thin film F3 (the via V2) do not overlap each other in a plan view (in the lamination direction). With this configuration, even when the thermal load is applied due to the heat treatment, or the outgas annealing process to achieve the eutectic joining, the contact electrode 142A may be prevented from being diffused into the piezoelectric thin film F3, thereby improving the dielectric strength, or electrostatic discharge (ESD) resistance.

In general, it is noted that Mo is a common material as a barrier metal, and its barrier performance is improved by making it thicker. Therefore, when Mo is used for the metal layer E2, it is possible to enhance the barrier performance by increasing the thickness of the metal layer E2. However, when the metal layer E2 is made to be thicker, deterioration in a Q value of the resonator 10 and deterioration in temperature characteristics are caused. In the resonance device 1 according to the present embodiment, the metal layer E2 (i.e., the electrode layer that is configured and functions as a metal layer for applying a voltage to the piezoelectric thin film F3) is not applied a voltage by the contact electrode 142A, but the metal layer E3 is. Therefore, by increasing the thickness of the metal layer E3 rather than the metal layer E2, the barrier performance may be improved without affecting the Q value and temperature characteristics.

Second Exemplary Embodiment

In the following description of a second embodiment and subsequent embodiments, description of the same matters as those of the first embodiment will be omitted, and only different points will be described. In particular, the same reference signs are given to the same configurations, and the same effects brought by the same configurations will not be described one by one for each subsequent embodiment.

Figure 8:
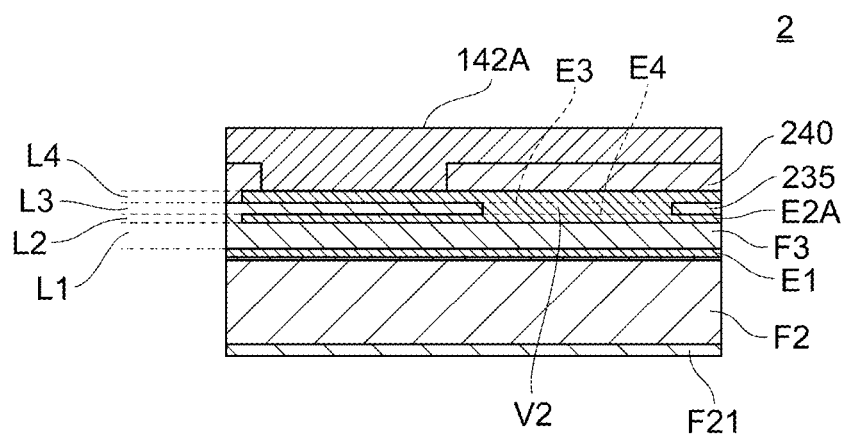
FIG. 8 is a schematic diagram illustrating a connection mode of a resonance device according to a second exemplary embodiment.

Hereinafter, of each of the configurations of a resonance device 2 according to the present embodiment, different points from the first embodiment will be described. FIG. 8 corresponds to FIG. 5, and illustrates a connection mode of the contact electrode 142A of the relocation wiring W2 and a metal layer E2A (that is, an upper electrode) according to the present embodiment, in the resonance device 2 according to the present embodiment.

The metal layer E2A is formed of, for example, Mo or W, and is also formed in a direction in which the metal layer E3 extends. In other words, the metal layer E2A and the metal layer E3 overlap each other at a portion where the metal layer E3 and the contact electrode 142A are in contact with each other. Therefore, in the present embodiment, the metal layer E2A and the protective film 235 are present between the piezoelectric thin film F3 and a contact portion of the contact electrode 142A and the metal layer E3.

With the connection mode in the resonance device 2 according to the present embodiment, when the contact electrode 142A is diffused into the protective film 235, it is possible to prevent diffusion from spreading into the piezoelectric thin film F3 by a barrier performance of the metal layer E2A. This improves dielectric strength, or electrostatic discharge (ESD) resistance. Other configurations and functions are the same as those of the first embodiment.

Third Exemplary Embodiment

Figure 9:
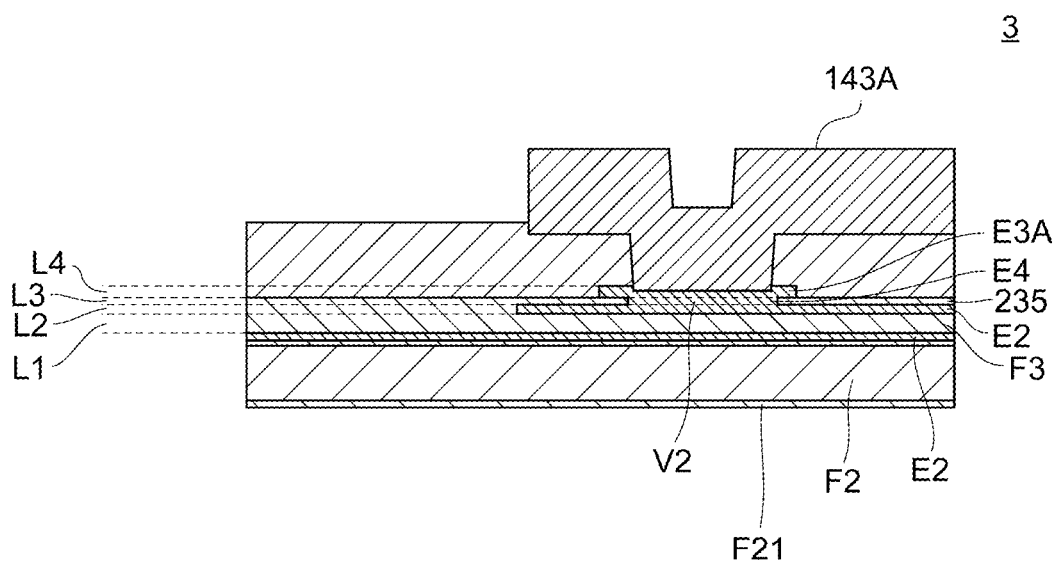
FIG. 9 is a schematic diagram illustrating a connection mode of a resonance device according to a third exemplary embodiment.

Hereinafter, of each of the configurations of a resonance device 3 according to the present embodiment, different points from the first embodiment will be described. FIG. 9 corresponds to FIG. 5, and illustrates a connection mode of a contact electrode 143A of relocation wiring W2 and the metal layer E2 according to the present embodiment, in the resonance device 3 according to the present embodiment.

In the resonance device 3 according to the present embodiment, a metal layer E3A is formed so as to cover substantially the entire surface of the via V2. The contact electrode 143A is connected to the metal layer E3A on an upper side of the via V2.

According to the connection mode of the resonance device 3, the metal layer E2, a metal E4, and the metal layer E3A are laminated at a contact portion between the contact electrode 143A and the metal layer E3A, so that an increase in total thickness of the metal layers of Mo or the like is achieved. With this configuration, the barrier performance at the contact portion can be improved without increasing the thickness of the metal layer E2, which functions as an upper electrode. As a result, dielectric strength, or ESD resistance may be improved without affecting a Q value of the resonator 10 and temperature characteristics. According to the connection mode of the resonance device 3, since the position offset of the via V2 as in the resonance devices 1 and 2 is not necessary, it is possible to achieve the miniaturization of the device. Other configurations and functions are the same as those of the first embodiment.

Fourth Exemplary Embodiment

Figure 10:
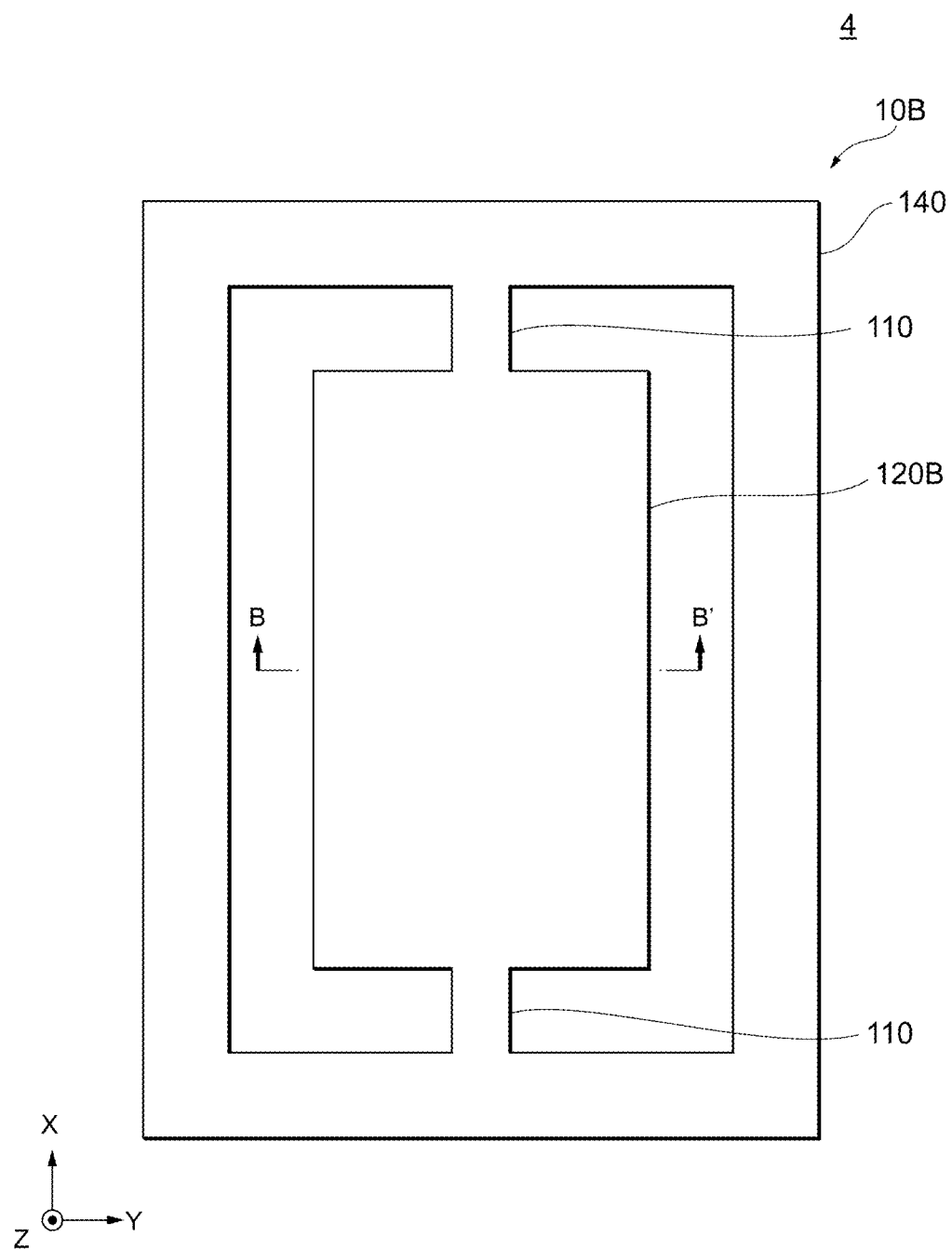
FIG. 10 is a plan view of a resonator according to a fourth exemplary embodiment.

Hereinafter, of each of the configurations of the resonance device 4 according to the present embodiment, different points from the first embodiment will be described. FIG. 10 corresponds to FIG. 3, and is a plan view illustrating a planar structure of a resonator 10B of a resonance device 4 according to the present embodiment.

The resonator 10B is a contour vibrator configured to perform in-plane vibration in an X-Y plane in an orthogonal coordinate system in FIG. 10. As illustrated in FIG. 10, the resonator 10B includes a vibration portion 120B instead of the vibration portion 120 in the first embodiment.

The vibration portion 120B has a plate-like contour extending in a planar shape along the X-Y plane. The vibration portion 120B is provided on an inner side of the holding portion 140, and a space is formed between the vibration portion 120B and the holding portion 140 (i.e., the frame) at a predetermined interval. A pair of opposing holding arms 110 connected the vibration portion 120B to the holding portion 140.

Figure 11:
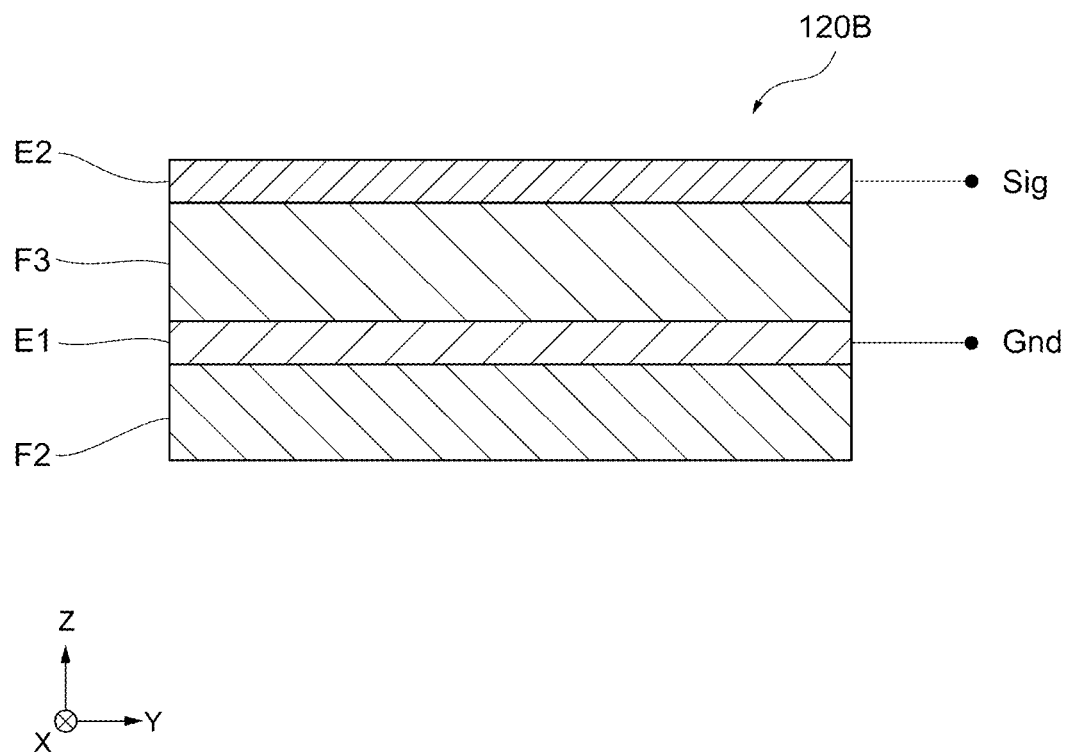
FIG. 11 is a cross-sectional view taken along a line B-B' in FIG. 10.

FIG. 11 is a cross-sectional view taken along a line B-B' in FIG. 10, and illustrates a cross-sectional structure of the vibration portion 120B. The vibration portion 120B is formed by laminating a metal layer (i.e., a lower electrode) E1 on the substrate F2. Then, the piezoelectric thin film F3 is laminated on the lower electrode E1 to cover the lower electrode E1, and the metal layer (i.e., an upper electrode) E2 is layered on the piezoelectric thin film F3. Any one of the modes described in the first to third embodiments is used for connection between the upper electrode E2 and an external power source. Other configurations and functions are the same as those of the first embodiment.

Additional Exemplary Embodiments

In the aforementioned embodiments, examples are described in which the MEMS device according to the present invention is used as a resonance device including the resonator 10, but the MEMS device of the present invention is not limited thereto. The exemplary embodiments of the present invention may be applied to, for example, an optical scanner type MEMS mirror, a piezoelectric microphone, FBAR and RAW filters, a bulk wave resonator, a piezoelectric transducer, an electrostatic MEMS element, an electromagnetically driven MEMS element, a piezoresistive MEMS element, a gyro sensor, an acceleration sensor, and the like. The present invention is also applicable to a MHz vibrator to be used for a MHz oscillator. Examples of other MEMS devices in which an upper electrode is connected to an external power source in the connection mode of the present invention will be described below. In the following description, the same reference signs are given to the same configurations as those of the aforementioned embodiments, and the same effects brought by the same configurations will not be described.

Piezoelectric Microphone

An outline of a MEMS device 5 will be described with reference to FIGS. 12A and 12B. The MEMS device 5 is a device for configuring a MEMS microphone configured to convert sound pressure into an electric signal. FIG. 12A is a perspective view of the MEMS device 5, and FIG. 12B is a cross-sectional view taken along a line C-C' in FIG. 12A.

Referring to FIG. 12A, the MEMS device 5 includes a vibration plate 210, a supporter 211, and a piezoelectric unit 212. The MEMS device 5 is divided into two sections by, for example, a small slit 213 with a size of about 1 µm or less.

In this exemplary embodiment, the vibration plate 210 is a thin film configured to vibrate in accordance with sound pressure, and is formed of silicon (Si). The vibration plate 210 has a substantially rectangular shape, and lower portions of a pair of sides 214 and 215 opposing each other are each supported by the supporter 211. That is, the vibration plate 210 has a double-supported beam structure. The Si that forms the vibration plate 210 is a degenerate n-type Si semiconductor having resistivity of 1.5 mΩ·cm or less, and has a function as a lower electrode of the piezoelectric unit 212, as will be described later.

As further shown, the piezoelectric unit 212 is disposed on the vibration plate 210 along a portion supported by the supporter 211. In the configuration illustrated in FIG. 12A, four piezoelectric units 212 are disposed on the vibration plate 210, but the number of piezoelectric units 212 is not limited thereto. In the configuration illustrated in FIG. 12A, an end portion of each piezoelectric unit 212 is arranged on the side 214 or 215, but the end portion thereof may be arranged separate from the side 214 or 215.

FIG. 12B is a cross-sectional view of the MEMS device 5 taken along the line C-C' in FIG. 12A. The supporter 211 includes a base body 220 and an insulating layer 221.

The base body 220 is formed of, for example, silicon (Si). The insulating layer 221 is formed of, for example, silicon oxide ($SiO_2$). On the supporter 211 formed as described above, the vibration plate 210 is formed.

The piezoelectric unit 212 disposed on the vibration plate 210 along the portion supported by the supporter 211 includes the piezoelectric thin film F3, the metal layer (e.g., upper electrode) E2, and the wiring W1 and wiring W2.

In the present embodiment, the piezoelectric thin film F3 is disposed on the vibration plate 210 to vibrate in accordance with vibrations of the vibration plate 210. The ratio of a width (D) of a vibration portion of the piezoelectric thin film F3 with respect to a width (C) from the center of the vibration plate 210 to the supporter 211 may be set to be about 40%, for example. For example, the width C can be about 300 µm, and the width D can be about 120 µm.

The upper electrode E2 is disposed on the upper side of the piezoelectric thin film F3. In the present embodiment, the upper electrode E2 can have a thickness of about 50 nm, for example. The upper electrode E2 can have a structure having tensile stress. By making the upper electrode E2 have the tensile stress, stress in the piezoelectric unit 212 is corrected, and deformation of the vibration plate 210 can be suppressed.

In the MEMS device 5 having the configuration as described above, the piezoelectric thin film F3 is configured to vibrate in accordance with the vibrations of the vibration plate 210 by the sound pressure. Then, a voltage in accordance with the vibrations of the piezoelectric thin film F3 is output through the wiring W1 and wiring W2 of the piezoelectric unit 212.

In general, it is noted that any one of the modes and configurations described in the first to third embodiments can be used for connection between the upper electrode E2 and the wiring W2.

Bulk Wave Resonator

Figure 13A:
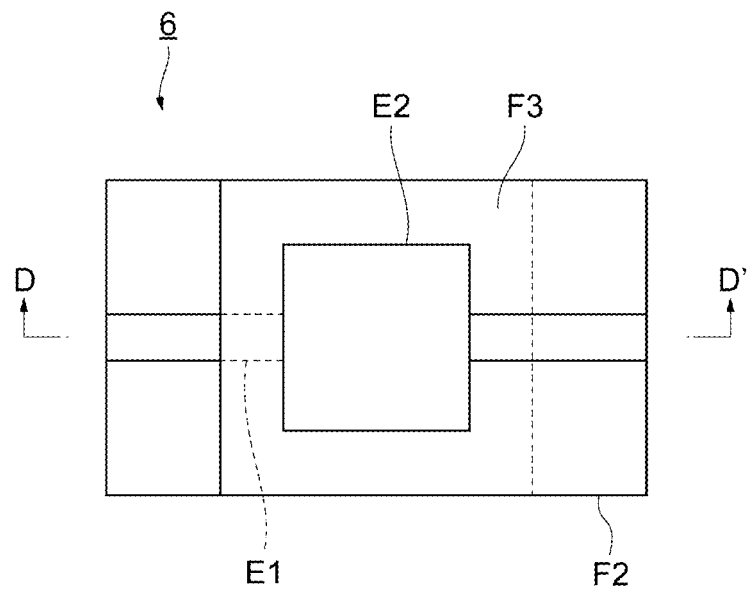
FIG. 13A is a diagram for explaining a modification example of a MEMS device.
Figure 13B:
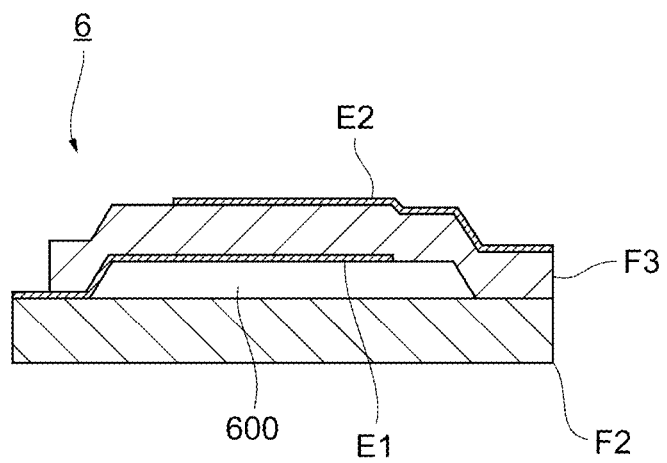
FIG. 13B is a cross-sectional view taken along a line D-D' in FIG. 13A.

An outline of a MEMS device 6 will be described with reference to FIGS. 13A and 13B. The MEMS device 6 is a device that configures a bulk wave resonator using a bulk wave propagating through a piezoelectric body. FIG. 13A is a plan view of the MEMS device 6, and FIG. 13B is a cross-sectional view taken along a line D-D' in FIG. 13A.

The MEMS device 6 includes the Si substrate F2. The piezoelectric thin film F3 is laminated on the Si substrate F2. The piezoelectric thin film F3 is fixed to an upper surface of the Si substrate F2 as a first principal surface thereof. It is noted that, however, the piezoelectric thin film F3 has a portion floated from the upper surface of the Si substrate F2 across a space 600. This floated portion is acoustically isolated with respect to the Si substrate F2. In the example of FIG. 13B, the piezoelectric thin film F3 is physically floated, but the configuration thereof is not limited thereto. Since it is sufficient for the piezoelectric thin film F3 to be acoustically isolated, it may be formed on, for example, an acoustic reflection layer.

The metal layer (i.e., a lower electrode) E1 is formed on a lower surface of the piezoelectric thin film F3. The metal layer (i.e., an upper electrode) E2 is formed on an upper surface of the piezoelectric thin film F3. The lower electrode E1 overlaps with the upper electrode E2 with the piezoelectric thin film F3 interposed therebetween.

A portion where the lower electrode E1 and the upper electrode E2 overlap with each other with the piezoelectric thin film F3 interposed therebetween, configures a piezoelectric vibration portion. That is, the piezoelectric vibration portion is excited by applying an AC electric field between the lower electrode E1 and the upper electrode E2. The MEMS device 6 utilizes the bulk wave generated by the excitation.

It is noted that any of the modes and configurations described in the first to third embodiments can be used for connection between the upper electrode E2 and an external power source.

Ultrasonic Transducer

Figure 14A:
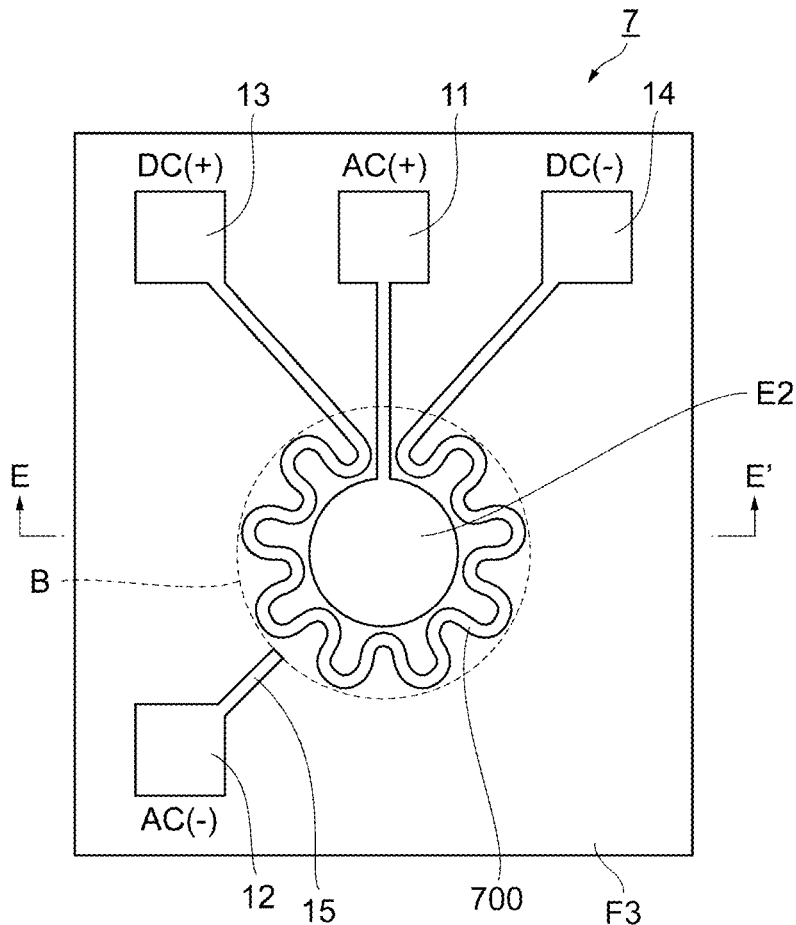
FIG. 14A is a diagram for explaining a modification example of a MEMS device.
Figure 14B:
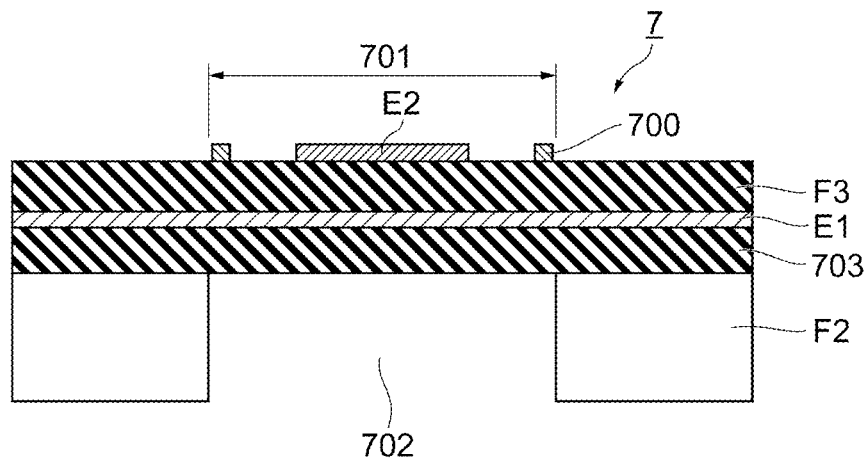
FIG. 14B is a cross-sectional view taken along a line E-E' in FIG. 14A.

An outline of a MEMS device 7 will be described with reference to FIGS. 14A and 14B. The MEMS device 7 is a device that configures an ultrasonic transducer. FIG. 14A is a plan view of the MEMS device 7, and FIG. 14B is a cross-sectional view taken along a line E-E' in FIG. 14A.

The MEMS device 7 in this embodiment includes an Si substrate F2; a piezoelectric thin film F3 disposed on the upper side relative to the Si substrate F2 while being supported directly or indirectly by the Si substrate F2 in such a manner that at least part of a membrane section 701 does not overlap with the Si substrate F2; the metal layer (i.e., a lower electrode) E1 disposed on a lower side of the piezoelectric thin film F3 at least in the membrane section 701; and the metal layer (i.e., an upper electrode) E2 disposed on an upper side of the piezoelectric thin film F3 in such a manner as to oppose at least part of the lower electrode E1 with the piezoelectric thin film F3 interposed therebetween in the membrane section 701. Moreover, a heater 700 is disposed on the upper side of the piezoelectric thin film F3 in addition to the upper electrode E2, or at least part of the upper electrode E2 serves as the heater 700. In the MEMS device 7 illustrated in FIG. 14A, the heater 700 is disposed on the upper side of the piezoelectric thin film F3 in addition to the upper electrode E2.

As illustrated in FIG. 14A, electrodes 11 to 14 are provided on the upper surface of the piezoelectric thin film F3, the electrode 11 is connected to the upper electrode E2, and the electrode 12 is connected to the lower electrode E1. Since the lower electrode E1 is located not at a height of the upper surface of the piezoelectric thin film F3 but at a height of the lower surface thereof, wiring 15 extended from the electrode 12 passes through the piezoelectric thin film F3 halfway in a thickness direction.

As further shown, a through-hole 702 is provided in a central portion of the Si substrate F2. The through-hole 702 can be formed by etching the Si substrate F2 from the lower surface side of the Si substrate F2.

Of a support layer 703, the lower electrode E1, the piezoelectric thin film F3, and the upper electrode E2, a portion arranged above the through-hole 702 configures the membrane section 701. The membrane section 701 has a set width and is able to vibrate. The membrane section 701 does not overlap with the Si substrate F2. In the example of FIG. 14B, a range of the membrane section 701 is substantially coincident with the range of the through-hole 702.

As illustrated in FIG. 14A, the upper electrode E2 is provided as a circular conductor film in a central portion of a region overlapping with the through-hole 702. A portion of the upper electrode E2 located in the membrane section 701 and facing the lower electrode E1 may function as an electrode for driving/detecting.

In the MEMS device 7, at least one of the upper electrode E2 and the lower electrode E1 functions as a drive electrode and/or a detection electrode in a portion where the upper electrode E2 and the lower electrode E1 face each other.

When the MEMS device 7 performs "transmission", an alternating current signal is applied between the upper electrode E2 and the lower electrode E1 to vibrate the membrane section 701, thereby generating sound waves. In the case of performing "reception", when the membrane section 701 is displaced by sound waves from an outside, electric charge is generated in the piezoelectric thin film F3, and the generated electric charge is output from a combination of the upper electrode E2 and the lower electrode E1.

It is noted that any of the modes and configurations described in the first to third embodiments can be used for connection between the upper electrode E2 and an external power source.

Mirror

Figure 15A:
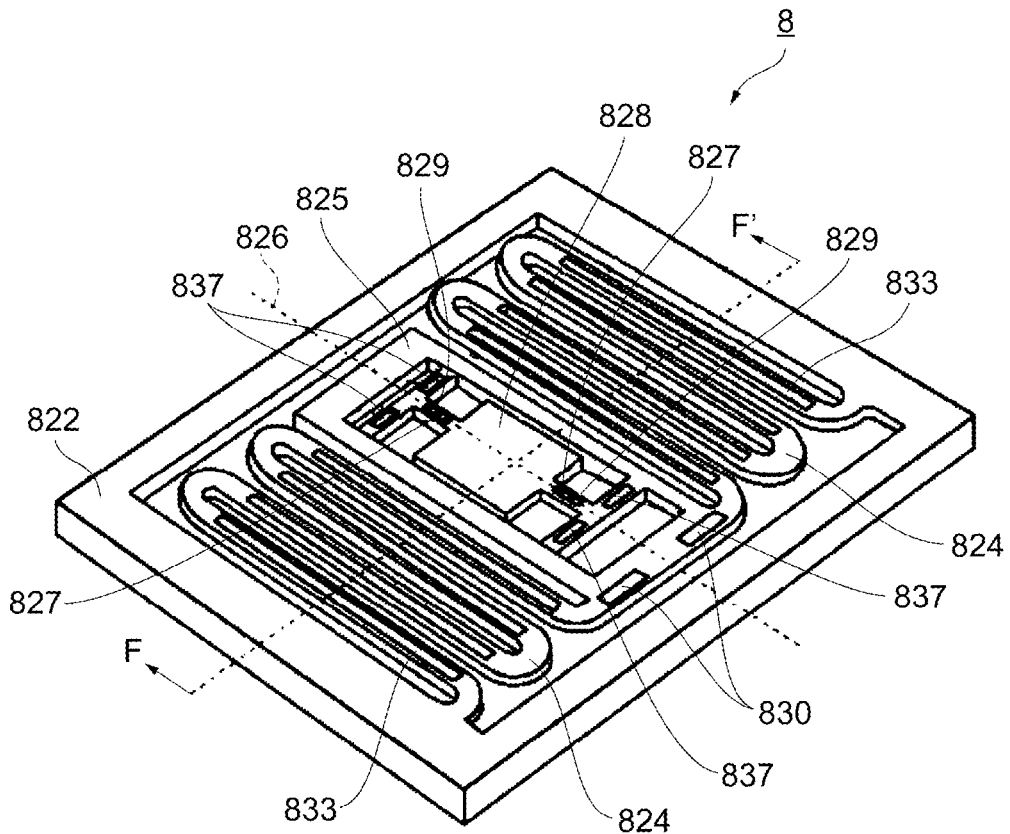
FIG. 15A is a diagram for explaining a modification example of a MEMS device.
Figure 15B:
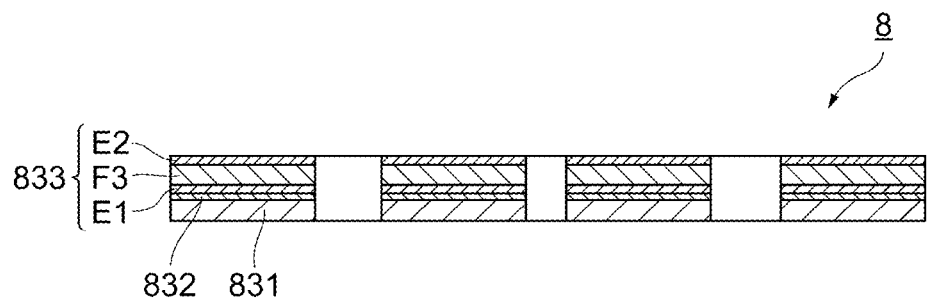
FIG. 15B is a cross-sectional view taken along a line F-F' in FIG. 15A.

An outline of a MEMS device 8 will be described with reference to FIGS. 15A and 15B. The MEMS device 8 is a device to configure a MEMS mirror. FIG. 15A is a perspective view of the MEMS device 8, and FIG. 15B is a cross-sectional view taken along a line F-F' in FIG. 15A.

As illustrated in FIG. 15A, the MEMS device 8 includes a fixed frame 822, a pair of first vibration portions 824, a movable frame 825, a pair of second vibration portions 827, a movable portion 828, and first monitor signal detectors (hereinafter, referred to as detectors) 830.

The first vibration portions 824 each face an inner side of the fixed frame 822, one end thereof is connected to the inner side of the fixed frame 822, and the other end thereof is connected to an outer side portion of the movable frame 825. The first vibration portions 824 are each formed in a meander shape. The second vibration portions 827 each face an inner side of the movable frame 825, one end thereof is connected to the inner side of the movable frame 825, and the other end thereof is connected to the movable portion 828.

In FIG. 15A, the first vibration portions 824 extend along an X-axis 823, and the second vibration portions 827 extend along a Y-axis 826. The detectors 830 are each provided at a connecting portion between the movable frame 825 and the first vibration portion 824, and detects displacement of the movable frame 825.

By making a principal surface of the movable portion 828 be a mirror surface, the principal surface thereof can be used as an optical reflection element, and can be used as an infrared detection element or the like by making the principal surface thereof be a light receiving surface. The second vibration portions 827 are each provided with a second monitor signal detector (hereinafter, referred to as a detector) 829 configured to detect a driving state (displacement) of the second vibration portion 827.

Each of the first vibration portions 824 is provided with a first drive unit 833 configured to control displacement of the first vibration portion 824, and each of the second vibration portions 827 is provided with a second drive unit 837 configured to control displacement of the second vibration unit 827.

FIG. 15B is a cross-sectional view of the MEMS device 8 taken along a line FF' illustrated in FIG. 15A. The first vibration portion 824 includes a substrate 831 and an insulator 832 formed on the substrate 831. The first drive unit 833 is formed on the insulator 832.

The first drive unit 833 is configured of the metal layer (i.e., a lower electrode) E1, the piezoelectric thin film F3 formed on the lower electrode E1, and the metal layer (i.e., an upper electrode) E2 formed on the piezoelectric thin film F3.

When a predetermined potential difference is given between the lower electrode E1 and the upper electrode E2, the piezoelectric thin film F3 expands and contracts in a planar direction of the piezoelectric thin film F3 due to an inverse piezoelectric effect. With this, the first drive unit 833 including the piezoelectric thin film F3 generates bending displacement in the thickness direction. At this time, in the first vibration portions 824, by applying an electric field in an opposite direction to each adjacent vibration beam, the deflection generated along the Y-axis 826 direction is superimposed, and the movable frame 825 including the movable portion 828 rotates about the X-axis 823.

It is noted that any of the modes and configurations described in the first to third embodiments can be used for connection between the upper electrode E2 and an external power source.

The MEMS device 1 according to the first exemplary embodiment includes the piezoelectric film F3, the first electrode E1 and the second electrode E2 sandwiching the piezoelectric film F3, the protective film 235 provided to cover at least part of the second electrode and having the cavity V2 that opens part of the second electrode, the third electrode E3 (E4) that contacts the second electrode E2 at least in the cavity V2 and is provided so as to cover at least part of the protective film, and the first wiring layer W2 having the first contact portion 142A in contact with the third electrode E3. According to the above connection mode, the layer in which the first wiring layer W2 applies a voltage differs from a layer in which a voltage is applied to the piezoelectric film F3. With this configuration, even when the thermal load is applied due to the heat treatment, or the outgas annealing process to achieve the eutectic joining, the first contact portion 142A can be prevented from being diffused into the piezoelectric thin film F3, thereby improving the dielectric strength or the electrostatic discharge (ESD) resistance.

It is preferable for the MEMS device 1 to further include the second wiring layer W1 having the second contact portion 141A in contact with the first electrode E1.

The MEMS device 1 may further include the piezoelectric vibration portion 120 having the piezoelectric film F3 and the first and second electrodes E1, E2 sandwiching the piezoelectric film F3. The third electrode E3 may extend to a region in an outer side portion relative to a region of the piezoelectric vibration portion 120 in a plan view, and the first contact portion 142A of the first wiring layer W2 may be provided in the region in the outer side portion.

Further, the MEMS device 1 may further include the holding portion 140 provided in at least part of the periphery of the piezoelectric vibration portion 120; and the holding arm 110 provided between the piezoelectric vibration portion 120 and the holding portion 140, and having one end thereof connected to the piezoelectric vibration portion 120 and the other end thereof connected to the holding portion 140, wherein the first contact portion 142A of the first wiring layer W2 may be provided in the holding portion 140.

The first contact portion 142A of the first wiring layer W2 may be disposed to be offset in a plan view with respect to the cavity V2 where the third electrode E3 and the second electrode E2 make contact with each other.

At least the protective film 235 may be provided between the first contact portion 142A of the first wiring layer W2 and the piezoelectric film F3.

In the above connection mode, the structure is such that a region in which the first wiring layer W2 applies a voltage and a region in which a voltage is applied to the piezoelectric thin film F3 are offset in a plan view. With this configuration, even when the thermal load is applied due to the heat treatment or the outgas annealing process to achieve the eutectic joining, the first contact portion 142A can be prevented from being diffused into the piezoelectric thin film F3, thereby improving the dielectric strength or the electrostatic discharge (ESD) resistance.

At least the protective film 235 and the second electrode E2 may be provided between the first contact portion 142A of the first wiring layer W2 and the piezoelectric film F3. With this mode and configuration, when the first contact portion 142A is diffused into the protective film 235, it is possible to prevent the diffusion from spreading into the piezoelectric film F3 by the barrier performance of the second electrode E2A. This configuration improves the dielectric strength or the electrostatic discharge (ESD) resistance.

Moreover, the first contact portion 142A of the first wiring layer W2 may be disposed to overlap in a plan view with the cavity V2 where the third electrode E3 and the second electrode E2 make contact with each other. According to this mode, since the offset between the first contact portion 142A and the cavity V2 is unnecessary, it is possible to achieve miniaturization of an element.

At least one of the first, second, and third electrodes may be formed of molybdenum or tungsten as a main ingredient.

The piezoelectric film F3 may be formed of a material whose crystal structure takes a wurtzite hexagonal crystal structure, as a main ingredient.

The third electrode E3 may be formed to be thicker than the second electrode E2.

The first wiring layer W2 may be formed of aluminum as a main ingredient. It is preferable that the first wiring layer W2 and the third electrode E3 contain different materials as main ingredients from each other.

In general, it is noted that the exemplary embodiments described above are intended to facilitate the understanding of the present invention, and are not intended to limit the interpretation of the present invention. The present invention may be modified and/or improved without departing from the spirit and scope thereof, and equivalents thereof are also included in the present invention. That is, exemplary embodiments obtained by those skilled in the art applying design change as appropriate on the embodiments are also included in the scope of the present invention as long as the obtained embodiments have the features of the present invention. For example, each of the elements included in each of the embodiments, and arrangement, materials, conditions, shapes, sizes, and the like thereof are not limited to those exemplified above, and may be modified as appropriate. It is to be understood that the exemplary embodiments are merely illustrative, partial substitutions or combinations of the configurations described in the different embodiments are possible to be made, and configurations obtained by such substitutions or combinations are also included in the scope of the present invention as long as they have the features of the present invention.

REFERENCE SIGNS LIST 1 to 4 RESONANCE DEVICE (MEMS DEVICE)
T4 TERMINAL
5 to 8 MEMS DEVICE
10, 10B RESONATOR
20 LOWER LID
21 RECESS
22 BOTTOM PLATE
23 SIDE WALL
30 UPPER LID
31 RECESS
33 SIDE WALL
34 GETTER LAYER
110 HOLDING ARM
120, 120B VIBRATION PORTION
130 BASE PORTION
135 (135A to 135D) VIBRATION ARM
140 HOLDING PORTION
141A, 142A, 143A CONTACT ELECTRODE
141B, 142B CONNECTION LAYER

The invention claimed is:

1. A MEMS device comprising:
a piezoelectric film;
a first electrode and a second electrode sandwiching the piezoelectric film;
a protective film that covers at least part of the second electrode and has a cavity that opens at least a part of the second electrode;
a third electrode in contact with the second electrode at least in the cavity of the protective film and that covers at least part of the protective film; and
a first wiring layer including a first contact portion in contact with the third electrode.

2. The MEMS device according to claim 1, further comprising a second wiring layer including a second contact portion in contact with the first electrode.

3. The MEMS device according to claim 1, further comprising:
a piezoelectric vibration portion including the piezoelectric film, and the first and second electrodes sandwiching the piezoelectric film,
wherein the third electrode extends to a region in an outer side relative to a region of the piezoelectric vibration portion in a plan view thereof.

4. The MEMS device according to claim 3, wherein the first contact portion of the first wiring layer is disposed in the region in the outer side.

5. The MEMS device according to claim 4, further comprising:
a frame disposed in at least part of a periphery of the piezoelectric vibration portion; and
a holding arm disposed between the piezoelectric vibration portion and the frame, and having a first end connected to the piezoelectric vibration portion and a second end of the holding arm connected to the frame,
wherein the first contact portion of the first wiring layer is disposed in the holding portion.

6. The MEMS device according to claim 1, wherein the first contact portion of the first wiring layer is disposed offset in a plan view relative to the cavity where the third electrode is coupled to the second electrode.

7. The MEMS device according to claim 1, wherein the protective film is disposed between the first contact portion of the first wiring layer and the piezoelectric film.

8. The MEMS device according to claim 1, wherein the protective film and the second electrode are disposed between the first contact portion of the first wiring layer and the piezoelectric film.

9. The MEMS device according to claim 1, wherein at least one of the first, second, and third electrodes comprises molybdenum or tungsten as a main ingredient.

10. The MEMS device according to claim 1, wherein the piezoelectric film comprises, as a main ingredient, a material with a wurtzite hexagonal crystal structure.

11. The MEMS device according to claim 1, wherein the third electrode comprises a greater thickness than a thickness of the second electrode.

12. The MEMS device according to claim 1, wherein the first wiring layer comprises aluminum as a main ingredient.

13. The MEMS device according to claim 1, wherein the first wiring layer comprises a different material as a main ingredient than a main ingredient of the third electrode.

14. The MEMS device according to claim 1, further comprising a parasitic capacitance reduction film disposed on an entirety of the protective film, such that the parasitic capacitance reduction film is disposed between a portion of the first wiring layer and the protective film.

* * * * *